United States Patent
Becker et al.

(10) Patent No.: US 7,005,910 B2
(45) Date of Patent: Feb. 28, 2006

(54) FEED-FORWARD CIRCUIT FOR REDUCING DELAY THROUGH AN INPUT BUFFER

(75) Inventors: Scott T. Becker, Darien, IL (US); Brian Reed, Cupertino, CA (US); Puneet Sawhney, San Jose, CA (US); Jayanth Thyamagundlam, Milpitas, CA (US)

(73) Assignee: ARM Physical IP, Inc., Sunnyvale, CA (US)

( * ) Notice: Subject to any disclaimer, the term of this patent is extended or adjusted under 35 U.S.C. 154(b) by 0 days.

(21) Appl. No.: 10/759,339

(22) Filed: Jan. 16, 2004

(65) Prior Publication Data
US 2005/0156642 A1   Jul. 21, 2005

(51) Int. Cl.
*H03K 17/04* (2006.01)
(52) U.S. Cl. .................. 327/374; 327/375; 327/376; 327/377
(58) Field of Classification Search ............... 327/374, 327/108; 326/82, 83, 85, 86, 87, 91
See application file for complete search history.

(56) References Cited

U.S. PATENT DOCUMENTS

| | | | | |
|---|---|---|---|---|
| 4,786,830 A | * | 11/1988 | Foss | 326/71 |
| 5,644,255 A | * | 7/1997 | Taylor | 326/81 |
| 6,034,557 A | * | 3/2000 | Schultz et al. | 327/276 |
| 6,137,313 A | * | 10/2000 | Wong et al. | 326/83 |
| 6,271,713 B1 | * | 8/2001 | Krishnamurthy | 327/534 |
| 6,504,402 B1 | * | 1/2003 | Horiguchi et al. | 326/121 |
| 6,784,719 B1 | * | 8/2004 | Okamoto et al. | 327/333 |

* cited by examiner

*Primary Examiner*—Tuan T. Lam
*Assistant Examiner*—Hiep Nguyen
(74) *Attorney, Agent, or Firm*—Martine Penilla & Gencarella, LLP

(57) ABSTRACT

An invention is provided for a feed forward circuit that reduces delay through an inverting circuit. The feed forward circuit includes an inverter having an input and an output, and an inverting circuit having an input and an output. The input of the inverting circuit is coupled to the output of the inverter. A feed forward transistor having a gate coupled to the input of the inverter and a terminal coupled to the output of the inverting circuit also is included. In operation the feed forward transistor decreases the amount of time required for the output of the inverting circuit to change state. In sum, the invention reduces the delay when the inverting circuit transitions to a high state, without affecting the timing of the transition to a low state.

2 Claims, 7 Drawing Sheets

FEED-FORWARD CIRCUIT FOR REDUCING DELAY THROUGH AN INPUT BUFFER

BACKGROUND OF THE INVENTION

1. Field of the Invention

This invention relates generally to semiconductor input/output circuits, and more particularly to feed-forward circuits for reducing delay through input buffers in integrated circuits (ICs).

2. Description of the Related Art

In today's world of ICs with ever smaller devices, board voltages have not been reduced at the same rate as IC voltages. As a result, there is a need for tolerant input/output (I/O) designs that can tolerate higher board voltages than the IC's internal voltage. That is, the input section of an I/O circuit generally requires some form of protection. For example, FIG. 1 shows an exemplary printed circuit board (PCB) configuration 100. The PCB configuration 100 includes a PCB 102 and a plurality of chips 104a–104b disposed on the PCB 102. Each chip 104a–104b includes an I/O ring 106a–106b that provides I/O operations for the chip 104a–104b. Although only two chips 104a–104b are illustrated in FIG. 1, it should be borne in mind that a typical PCB configuration 100 will include many chips disposed throughout the PCB 102.

The various chips on the PCB 102 may operate at different voltages. In this example, chip 104a is a 0.13 micron chip that operates at 1.2 volts, and chip 104b is a 0.25 micron chip that operations at 2.25 volts. A voltage mismatch occurs when chip 104b drives a signal at 2.25 volts, but chip 104a only has a 1.2 volt internal supply. Thus, the I/O devices within the I/O rings 106a–106b must be designed to handle such a voltage mismatch.

The I/O rings 106a–106b generally have voltages greater than the internal supply voltages of the chips. In this example, the ring voltage of I/O ring 106a is 3.3 volts and the ring voltage of I/O ring 106b is 5 volts. Thus, in the above example, the I/O ring 106b of chip 104b provides a 5 volt signal to the I/O ring 106a of chip 104a, which operates at 3.3 volts. After converting the 5 volt signal to the ring operating voltage of 3.3 volts, the I/O ring 106a converts the 3.3 volt signal to the core voltage of chip 104a, which is 1.2 volts.

FIG. 2 is a schematic diagram showing a prior art I/O ring circuit 200. The prior art I/O circuit 200 includes a pad I/O 204 providing a signal to a plurality of input buffers 202a–202b operating at ring voltage. An input buffer inverter 206 is used to convert the ring voltage at node 210 to a core voltage at node 212. A further input buffer 208, which operates at the core voltage, is included to provide drive current for driving heavily loaded core nodes.

As inverter 206 is driven by inverter 202b, which operates at ring voltages, inverter 206 must be constructed of ring transistors. Unfortunately, the ring transistors have high threshold voltages due to the higher operating voltage requirements. The high threshold voltages, high input voltage, and low supply voltage for inverter 206 cause the high going transition on node 212 to be slow. This is due to the reduced core voltage ($V_{DD}-V_{TP}$), and the delayed turn-on time for the ring p-channel transistor in inverter 206. FIG. 3 is a schematic diagram showing a prior art inverter 206 that converts from a ring voltage to a core voltage. As illustrated in FIG. 3, the inverter 206 includes a p-channel ring transistor 300 having a first terminal coupled to a core $V_{DD}$, a gate coupled to node 210, and a second terminal coupled to node 212 and an n-channel transistor 302. The n-channel transistor 302 includes a first terminal coupled to the p-channel transistor 300, a gate coupled to node 210, and a second terminal coupled to ground.

In operation, node 210 is the Ring $V_{DD}$ when node 210 is driven HIGH, which is higher than the Core $V_{DD}$. Thus, when node 210 is HIGH, Ring $V_{DD}$ is present at the gate of the p-channel ring transistor 300 and Core $V_{DD}$ is present at the source of the p-channel ring transistor 300. Using voltages from the example of FIG. 1, Ring $V_{DD}$ can be 3.3volts and the Core $V_{DD}$ can be 1.2 volts. In addition, the p-channel ring transistor 300 can be a 3.3 voltage transistor with a 700 mV threshold (referred to herein as $V_{TP}$). In this example, node 210 must fall to a voltage of Core $V_{DD}-V_T$ before the p-channel ring transistor 300 turns ON. Thus, in the above example, node 210 must fall to 1.2 V−0.700V=0.5 V before the p-channel ring transistor 300 turns ON. That is, node 210 must fall from 3.3 V to 0.5 V before the p-channel ring transistor 300 starts to turn ON. As a result, the p-channel ring transistor 300 is slow in driving node 212 HIGH.

In view of the foregoing, there is a need for a feed-forward circuit for reducing the delay through an input buffer. The feed-forward circuit should allow fast switching from ring voltage to core voltage when the ring voltage is much higher than the core voltage.

SUMMARY OF THE INVENTION

The present invention fills these needs by providing a feed-forward circuit for reducing delay through an input buffer. Embodiments of the present invention sense transition changes early and feed the transition information forward to enhance performance. In one embodiment, the feed-forward circuit includes an inverter having an input and an output, and an inverting circuit having an input and an output. The input of the inverting circuit is coupled to the output of the inverter. A feed forward transistor having a gate coupled to the input of the inverter and a terminal coupled to the output of the inverting circuit also is included. In operation the feed forward transistor decreases the amount of time required for the output of the inverting circuit to change state by at least one gate delay of the inverting circuit. In one aspect, the feed forward transistor increases a voltage at the output of the inverting circuit when the input to the inverter transitions to a HIGH state. In this aspect, the feed forward transistor ceases to increase the voltage at the output of the inverting circuit when the input to the inverter transitions to a LOW state. The inverting circuit can include a p-channel transistor and an n-channel transistor, where the p-channel transistor has a first terminal coupled to a core voltage, a gate coupled to the input of the inverting circuit and a second terminal coupled to a first terminal of the n-channel transistor. The n-channel transistor also has a gate coupled to the input of the inverting circuit. In this configuration a high impedance transistor, having a terminal coupled to ground, can be coupled to a second terminal of the n-channel transistor of the inverting circuit. Also, a low impedance transistor having a terminal coupled to ground can be coupled to the second terminal of the n-channel transistor of the inverting circuit. The low impedance transistor is ON when the output of the inverting circuit is HIGH and OFF when the output of the inverting circuit is LOW.

In a further aspect, a dual feed forward circuit is disclosed wherein the feed forward transistor decreases the voltage at the output of the inverting circuit when the input to the inverter transitions to a LOW state. In this aspect, the feed forward transistor ceases to decrease the voltage at the output of the inverting circuit when the input to the inverter transitions to a HIGH state. The inverting circuit includes an n-channel transistor and a p-channel transistor, the n-channel transistor having a first terminal coupled to ground, a gate coupled to the input of the inverting circuit and a second terminal coupled to a first terminal of the p-channel transistor, which also has a gate coupled to the input of the inverting circuit. Here, a high drive pull up transistor can be coupled to a second terminal of the p-channel transistor of the inverting circuit. The high drive pull up transistor includes a terminal coupled to a core voltage, and is ON when the output of the inverting circuit is LOW.

In a further embodiment of the present invention, a method for reducing delay through an input buffer is disclosed. A voltage transition change is sensed before a voltage at an input to an inverting circuit changes state. In response to sensing the voltage transition change, a voltage at the output of the inverting circuit is changed such that the amount of time required for the output of the inverting circuit to change state is decreased by at least one gate delay of the inverting circuit. In one aspect, the voltage transition change causes the input to the inverting circuit to transition to a LOW state. In this aspect, the voltage at an output of the inverting circuit is increased in response to sensing the voltage transition change. In addition, the impedance at a drain of an n-channel transistor is increased in the inverting circuit in response to sensing the voltage transition change. The voltage transition change is sensed at an input of an inverter, which has an output coupled to the input of the inverting circuit. The voltage transition change is sensed using an n-channel feed forward transistor that includes a gate coupled to the input of the inverter and a terminal coupled to the output of the inverting circuit.

A dual method is described in a further aspect of the present invention. 'Dual' in this context is a circuit, which performs the same function as the last circuit but whose signed transitions are the opposite of the first circuit. In this aspect, the voltage transition change causes the input to the inverting circuit to transition to a HIGH state. Here, a voltage at an output of the inverting circuit is decreased in response to sensing the voltage transition change. As above, the voltage transition change is sensed at an input of an inverter, which has an output coupled to the input of the inverting circuit. The voltage transition change is sensed using a p-channel feed forward transistor having a gate coupled to the input of the inverter and a terminal coupled to the output of the inverting circuit. Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An invention is disclosed for a feed-forward circuit for reducing delay through an input buffer. Broadly speaking, embodiments of the present invention sense transition changes early and feed the transition information forward to enhance performance. In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

In the following description, the voltage of the I/O ring will be referred to hereinafter as the "ring voltage" or "Ring $V_{DD}$." The internal voltage of the chip will be referred to hereinafter as the "core voltage" or "Core $V_{DD}$." The time delay experienced from the input terminal to the output terminal of a gate, such as an inverting circuit, will be referred to hereinafter as the "gate delay."

Figure 1:
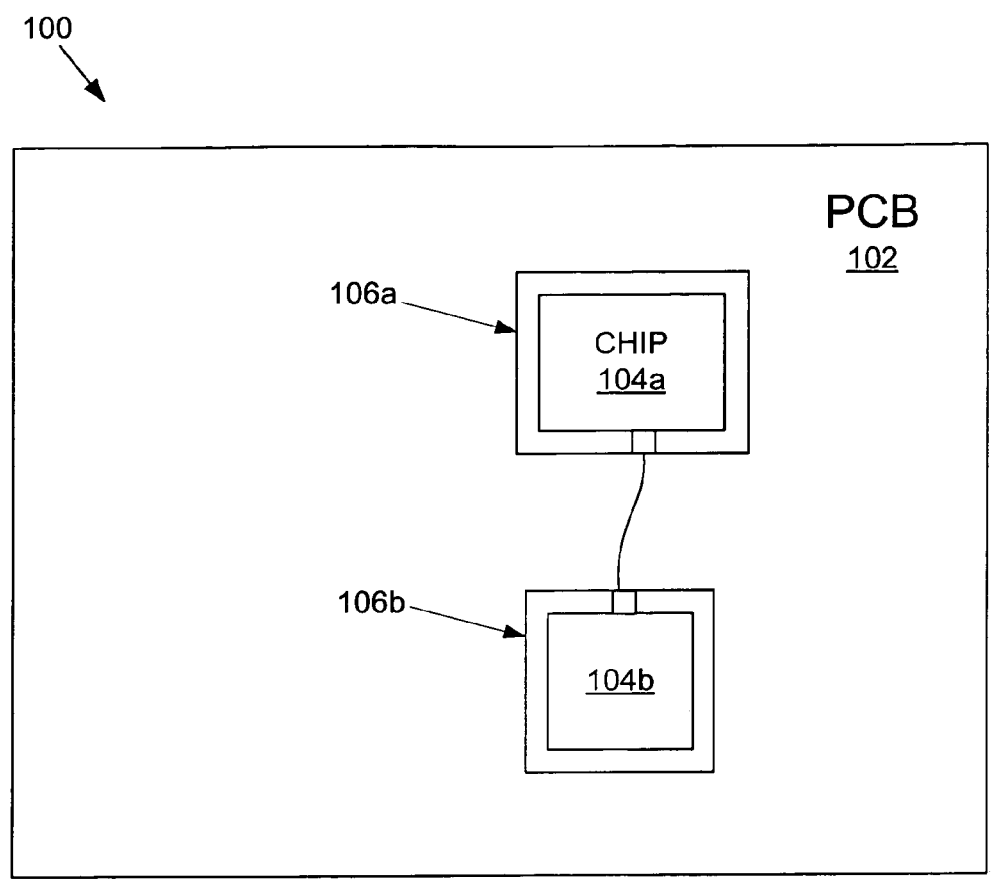
FIG. 1 shows an exemplary printed circuit board (PCB) configuration (Prior Art)
Figure 2:
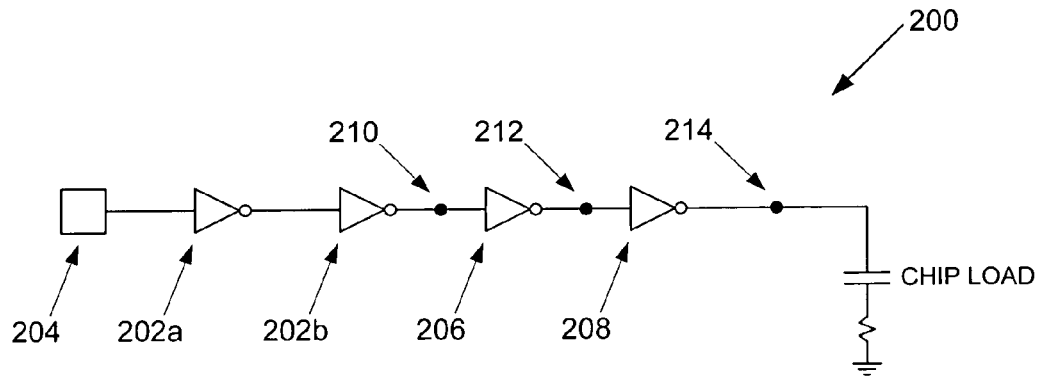
FIG. 2 is a schematic diagram showing an I/O ring circuit (Prior Art)
Figure 3:
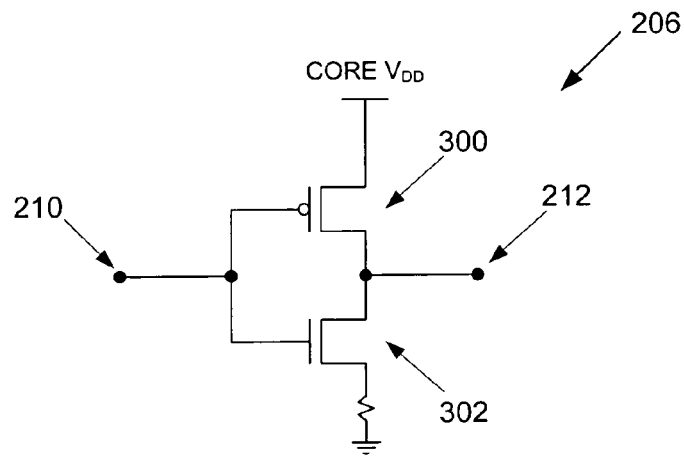
FIG. 3 is a schematic diagram showing an inverter that converts from a ring voltage to a core voltage (Prior Art)
Figure 4A:
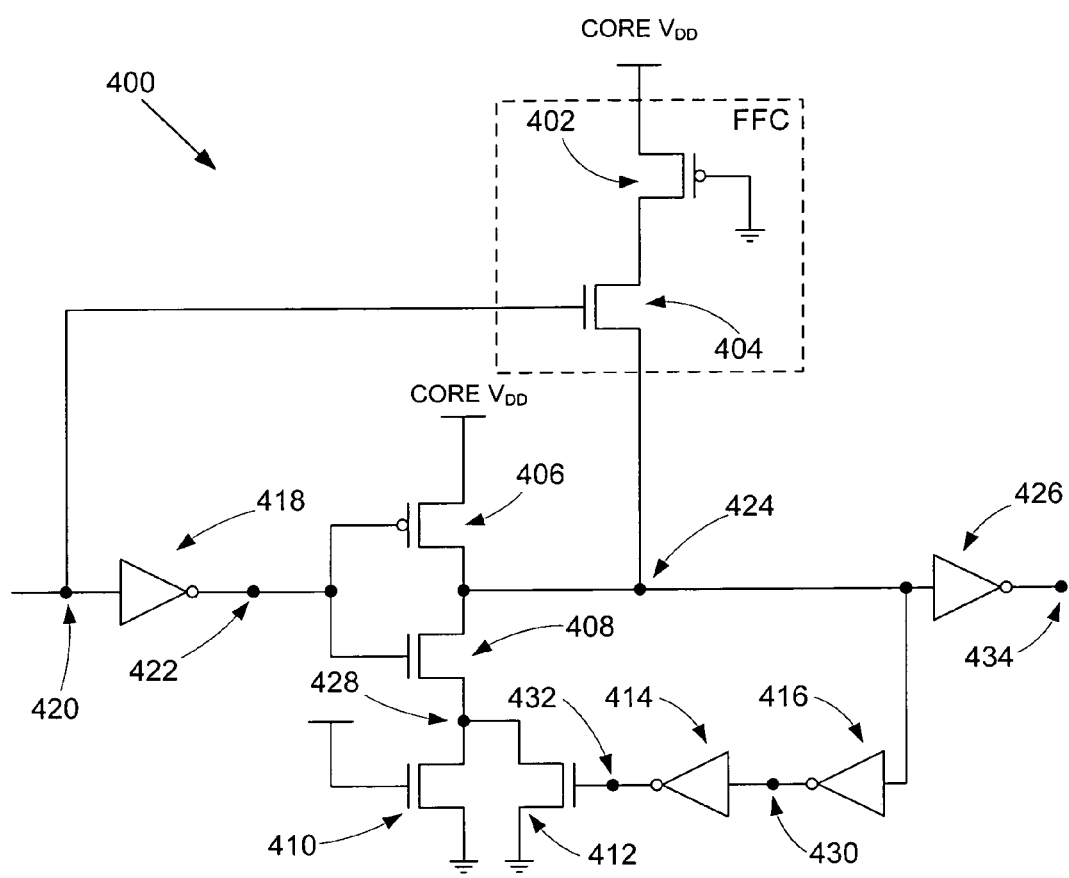
FIG. 4A is a schematic diagram showing a feed-forward circuit for converting from a ring voltage to a core voltage during a transition from LOW to HIGH, in accordance with an embodiment of the present invention.

FIGS. 1–3 were described in terms of the prior art. FIG. 4A is a schematic diagram showing a feed-forward circuit 400 for reducing delay when converting from a ring voltage to a core voltage during a transition from LOW to HIGH, in accordance with an embodiment of the present invention. The feed forward circuit 400 includes an inverter 418 operating at ring voltage, an inverter 426 operating at core voltage providing an output signal to node 434, and an inverter circuit that converts from the ring voltage to the core voltage and comprises p-channel transistor 406 and n-channel transistor 408. P-channel transistor 406 includes a gate coupled to node 422, a first terminal coupled to Core $V_{DD}$, and a second terminal coupled to node 424. N-channel transistor 408 includes a first terminal coupled to node 424, a gate coupled to node 422, and a second terminal coupled to node 428. It should be noted that the voltage at node 420 can be driven by any type of input device, such as a Schmitt-trigger or differential amplifier. Since different I/O specifications require different input devices, embodiments of the present invention are designed to function with any type of input device.

The feed-forward circuit 400 also includes an inverter 416, which includes an input coupled to node 424, and an output coupled to node 430. The input of inverter 414 is coupled to node 430 and its output is coupled to a gate of n-channel transistor 412. Transistor 412 also includes a first terminal coupled to node 428 and a second terminal coupled to ground. Also coupled to node 428 is a first terminal of n-channel transistor 410. Transistor 410 also has a gate coupled to Core $V_{DD}$ and a second terminal coupled to ground.

Further included in the feed-forward circuit 400 is an n-channel transistor 404. Transistor 404 includes a gate coupled to node 420, a first terminal coupled to p-channel transistor 402 and a second terminal coupled to node 424. P-channel transistor 402 includes a first terminal coupled to Core $V_{DD}$, a second terminal coupled to transistor 404 and a gate coupled to ground. In an additional embodiment, the gate of transistor 402 can be coupled to node 432, instead of ground.

In operation, when the voltage at node 420 is HIGH, the voltage at node 422 is pulled LOW via inverter 418. When the voltage at node 422 is pulled LOW, the voltage at node 424 should be asserted to Core $V_{DD}$ fast. However, as mentioned previously, conventional ring I/O inverters perform this operation slowly because of the decreased voltage supplied to the p-channel transistor within the converting inverter. To increase the speed with which node 424 is pulled to Core $V_{DD}$, embodiments of the present invention sense the rise at node 420 and feed the information forward to increase the voltage at node 424 quickly, despite having the lower core voltage at the source of p-channel transistor 406. In this manner, embodiments of the present invention decrease the amount of time required for node 424 to change from a LOW state to a HIGH state by at least one gate delay of the inverting circuit comprised on transistors 406 and 408.

In this example, inverter 418's ring voltage is 3.3 volts. Hence, when node 420 goes HIGH, node 420 goes to Ring $V_{DD}$, or 3.3 volts. When node 420 goes to Ring $V_{DD}$, node 422 goes to zero via inverter 418, and the Ring $V_{DD}$ at the gate of n-channel transistor 404 turns it ON. At most, the gate of n-channel transistor 404 can drive node 424 to gate voltage minus $V_T$ (GV–$V_T$). Given that the source terminal of transistor 404 is HIGH, node 424 can increase to a maximum voltage of GV–$V_T$, 3.3V–0.700V=2.6V. However, transistor 404 causes the voltage at node 424 to rise to either GV–$V_T$ or to the voltage at the drain of transistor 404, whichever is lower. As p-channel transistor 402 is connected to Core $V_{DD}$ (in this example, 1.2 volts), the voltage at node 424 can only rise to Core $V_{DD}$. That is, transistor 404 causes the voltage at node 424 to rise to either GV–$V_T$ or to Core $V_{DD}$, which ever is lower. Thus, the voltage at node 424 only rises to Core $V_{DD}$ (1.2 volts) and not GV–$V_T$ (2.6 volts) because the source of transistor 404 is only driven to Core $V_{DD}$ (1.2 volts).

The voltage at node 424 should rise quickly when node 422 goes LOW. Hence, embodiments of the present invention sense early that the voltage at node 424 should rise and then feed that information forward. To insure that node 432 is LOW and thus transistor 412 is OFF when the voltage at node 424 is about to make a HIGH transition, embodiments of the present invention utilize inverters 414 and 416. In particular, when the voltage at node 424 is LOW, inverter 416 switches node 430 HIGH, which causes inverter 414 to pull node 432 LOW and turns n-channel transistor 412 OFF.

N-channel transistor 412 is designed to be substantially larger in current carrying ability than n-channel transistor 410, which has a high impedance. That is, the W of transistor 412 is substantially larger than the W of transistor 410. For example, the W/L of transistor 410 can be 1/1 while the W/L of transistor 412 can be 25/0.18. Transistor 410 keeps the voltage at node 428 LOW when node 424 is supposed to be LOW.

Before the voltage at node 424 transitions from LOW to HIGH, the voltage at node 420 transitions to HIGH, which turns ON n-channel transistor 404. The gate voltage of transistor 404 is at ring voltage, which is much higher than the core voltage. Hence, when transistor 404 turns ON, transistor 404 allows the voltage at node 424 to be pulled up to the core voltage, via p-channel transistor 402, which is always ON because its gate is coupled to ground. At this point, the only hindrance to allowing the voltage at node 424 to go HIGH is n-channel transistor 408 and n-channel transistor 410, which are still ON because node 422 has not yet transitioned to LOW. That is, the voltage at node 420 transitions to HIGH before the voltage at node 422 transitions to LOW via inverter 418. However, n-channel transistor 410 has a W/L ratio of 1/1 and is weaker than n-channel transistor 404, which has a larger W/L ratio, for example, 9/0.35. As a result, transistor 404 is able to quickly pull up node 424. In addition, when the voltage at node 422 begins to fall, n-channel transistor 408 begins to turn OFF, resulting in the voltage at node 424 being pulled up to core voltage. Once the voltage at node 424 goes HIGH, inverter 416 drives the voltage at node 430 LOW, which causes inverter 414 to drive the voltage at node 432 HIGH, turning n-channel transistor 412 ON. In this manner, the circuit is prepared for a following falling transition.

By turning transistor 412 ON, a strong ground is provided for transistor 408 when transistor 408 begins to turn ON. As a result, when the voltage at node 422 goes HIGH, transistor 408 can drag the voltage at node 424 LOW very quickly because there are two strong transistors, transistor 408 and transistor 412, in series. In this manner, embodiments of the present invention advantageously can switch the voltage HIGH at node 424 quickly because transistor 410 is designed to be much weaker than transistor 404, allowing transistor 404 to easily pull the voltage at node 424 HIGH. In addition, embodiments of the present invention do not sacrifice drive strength when transitioning the voltage at node 424 LOW because transistor 412 is turned ON, making transistor 408 effectively stronger. Since a LOW transition will follow a HIGH transition, embodiments of the present invention turn transistor 412 ON knowing that transistor 408 is already OFF and waiting for a HIGH transition on node 422. As a result, embodiments of the present invention can switch the voltage LOW at node 424 quickly because transistor 412 in series with transistor 408 is designed to be strong. To create a LOW transition on node 424, node 422 must go HIGH and the input node 420 must transition LOW. A LOW going transition on node 420 will substantially weaken transistor 404 or turn it completely OFF. This feed forward of a LOW transition on node 420 allows node 424 to transition to a LOW faster than the prior art.

Figure 4B:
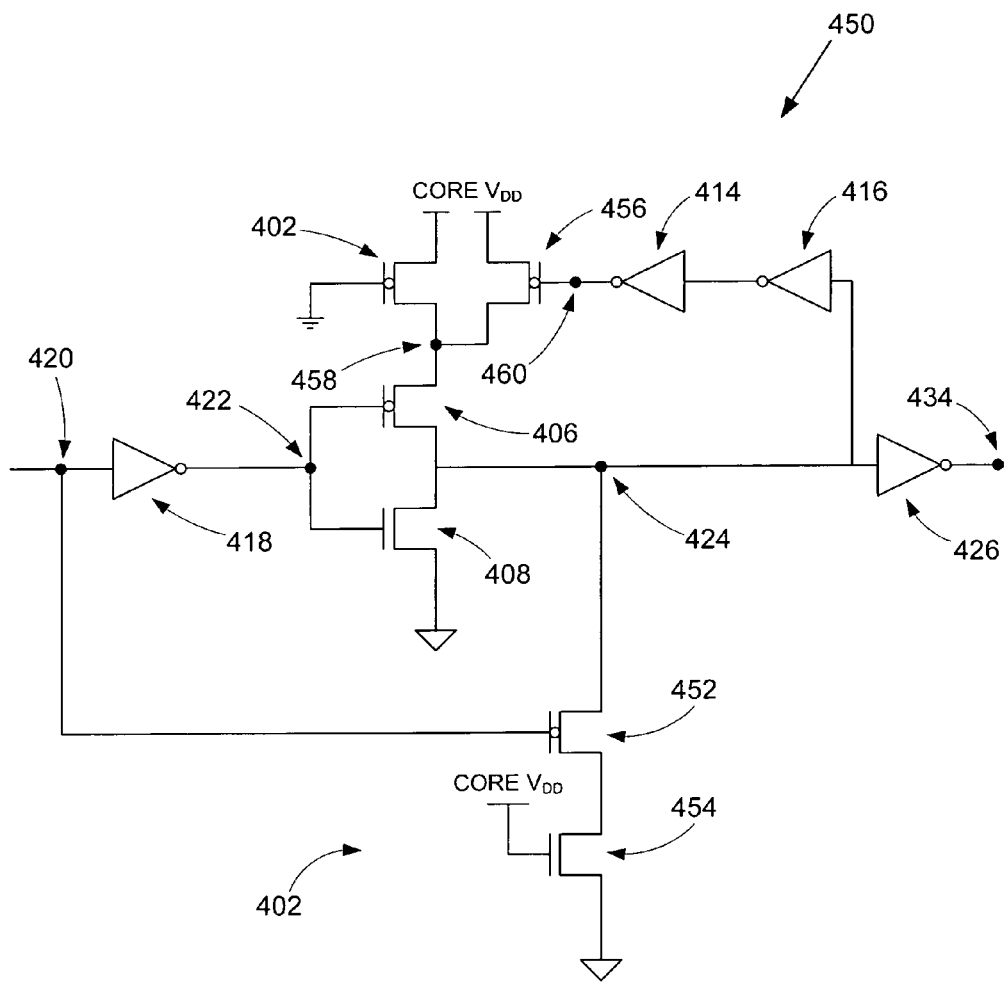
FIG. 4B is a schematic diagram showing a feed-forward circuit 450 for reducing delay when converting from a ring voltage to a core voltage during a transition from HIGH to LOW, in accordance with an embodiment of the present invention.

FIG. 4B is a schematic diagram showing a feed-forward circuit 450 for reducing delay when converting from a ring voltage to a core voltage during a transition from HIGH to LOW, in accordance with an embodiment of the present invention. The feed forward circuit 450 includes an inverter 418 operating at ring voltage, an inverter 426 operating at core voltage providing an output signal to node 434, and an inverter circuit that converts from the ring voltage to the core voltage and comprises p-channel transistor 406 and n-channel transistor 408. P-channel transistor 406 includes a gate coupled to node 422, a first terminal coupled to node 458, and a second terminal coupled to node 424. N-channel transistor 408 includes a first terminal coupled to node 424, a gate coupled to node 422, and a second terminal coupled to ground.

The feed-forward circuit 450 also includes an inverter 416, which includes an input coupled to node 424 and an output coupled an input of inverter 414, which inverter is coupled to a gate of p-channel transistor 456. Transistor 456 also includes a first terminal coupled Core $V_{DD}$ and a second terminal coupled to node 458. Also coupled to node 458, is a terminal of p-channel transistor 402, which transistor also includes a gate coupled to ground and a second terminal coupled to Core $V_{DD}$.

Further included in the feed-forward circuit 450 is a p-channel transistor 452, which transistor includes a gate coupled to node 420, a first terminal coupled to node 424 and a second terminal coupled to n-channel transistor 454. N-channel transistor 454 includes a first terminal coupled to transistor 452, a second terminal coupled to ground and a gate coupled Core $V_{DD}$.

The feed-forward circuit 450 of FIG. 4B functions as a dual, to the feed-forward circuit 400 of FIG. 4A. In particular, a LOW going transition at node 420 turns transistor 452 ON, beginning a LOW transition at node 424. As node 420 reaches ring $V_{DD}/2$ the inverter 418 transitions node 422 HIGH, turning ON transistor 408 and turning OFF transistor 406. Transistor 408 completes the LOW transition on node 424. The LOW on node 424 causes node 460 to go LOW through the inverters 416 and 414.

Transistor 402 is a resistive pull up designed to hold node 424 HIGH after a HIGH transition on node 420. When node 420 goes HIGH inverter 418 drives node 422 LOW, turning ON transistor 406 and turning OFF transistor 408. Node 424 is driven HIGH by transistors 406 and 456. The HIGH transition on node 424 causes node 460 to transition to HIGH after the two inverter delay through inverters 416 and 414, thus turning OFF the high drive pull up transistor 456. In this manner, embodiments of the present invention decrease the amount of time required for node 424 to change from a HIGH state to a LOW state by at least one gate delay of the inverting circuit comprised on transistors 406 and 408.

Figure 5:
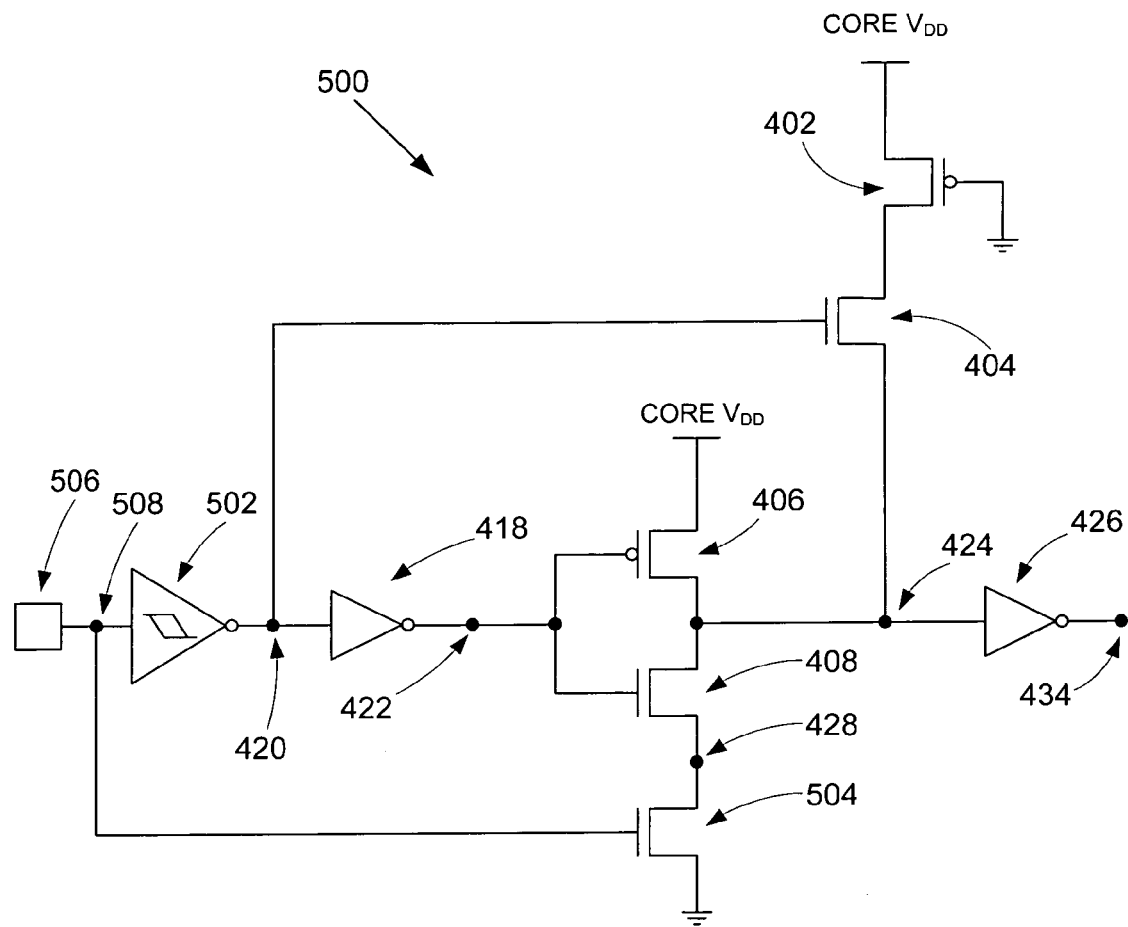
FIG. 5 is a schematic diagram showing a feed-forward circuit for converting from a ring voltage to a core voltage for use with a full rail swing signal, in accordance with an embodiment of the present invention.

FIG. 5 is a schematic diagram showing a feed-forward circuit 500 for converting from a ring voltage to a core voltage for use with a full rail swing signal, in accordance with an embodiment of the present invention. The feed forward circuit 500 includes an input buffer 502 having an input coupled to a pad I/O 506 and an output coupled to an input of inverter 418, which is operating at ring voltage. In addition, an inverter 426 is included that operates at core voltage and provides an output signal to node 434. Further included is an inverting circuit that converts from the ring voltage to the core voltage and comprises p-channel transistor 406 and n-channel transistor 408. P-channel transistor 406 includes a gate coupled to node 422, a first terminal coupled to Core $V_{DD}$ and a second terminal coupled to node 424. N-channel transistor 408 includes a first terminal coupled to node 424, a gate coupled to node 422 and a second terminal coupled to node 428.

Further included in the feed-forward circuit 500 is an n-channel transistor 404, which includes a gate coupled to node 420, a first terminal coupled to p-channel transistor 402 and a second terminal coupled to node 424. P-channel transistor 402 includes a first terminal coupled to Core $V_{DD}$, a second terminal coupled to transistor 404 and a gate coupled to ground. In addition, the feed-forward circuit 500 includes a low impedance transistor 504 having a first terminal coupled to node 428, a second terminal coupled to ground and a gate coupled to node 508.

As described above with reference to FIG. 4A, when node 420 is HIGH, node 422 is pulled LOW via inverter 418. When node 422 is pulled LOW, node 424 should be pulled to Core $V_{DD}$ fast. To increase the speed with which node 424 is pulled to Core $V_{DD}$, embodiments of the present invention sense the rise at node 420 and feed the information forward to increase the voltage at node 424 quickly. In addition, the embodiment of FIG. 5 senses a LOW at node 508 and feeds the information forward to turn OFF low impedance transistor 504.

Input buffer 418 operates at ring voltage, here 3.3 volts. When node 420 goes HIGH, node 420 goes to Ring $V_{DD}$. When node 420 goes to Ring $V_{DD}$, node 422 goes to zero via inverter 418, and Ring $V_{DD}$ at the gate of n-channel transistor 404 turns it ON. At most, the voltage at the gate of n-channel transistor 404 can drive node 424 to gate voltage minus $V_{TN}$ (GV–$V_{TN}$). Given that the voltage at the source terminal of transistor 404 is HIGH, the voltage at node 424 can increase to a maximum voltage of GV–$V_T$. Hence, if node 420 is at a ring voltage of 3.3 volts and $V_{TN}$ for transistor 404 is 0.700V, the voltage at node 424 can rise to a maximum of 3.3V–0.700V=2.6V. However, as mentioned above, transistor 404 causes the voltage at node 424 to rise to either GV–$V_T$ or to Core $V_{DD}$, which ever is lower. Thus, the voltage at node 424 only rises to Core $V_{DD}$ (1.2 volts) and not GV–$V_T$ (2.6 volts), because the drain of transistor 404 is only driven to Core $V_{DD}$ (1.2 volts).

Before the voltage at node 424 transitions from LOW to HIGH, the voltage at node 420 transitions to HIGH, which turns on n-channel transistor 404. The gate voltage of transistor 404 is at ring voltage, which is much higher than the core voltage. Hence, when transistor 404 turns ON, transistor 404 allows the voltage at node 424 to be pulled up to the core voltage via p-channel transistor 402.

At this point, the voltage at node 424 can go HIGH because the feed forward circuit 500 of FIG. 5 senses a LOW at node 508 and feeds the information forward to turn OFF low impedance transistor 504. In the feed forward circuit 400 of FIG. 4A, n-channel transistor 404 overcame a weak n-channel transistor 410 to begin pulling the voltage at node 424 HIGH. However, in the feed forward circuit 500 of FIG. 5, the n-channel transistor 404 does not have to overcome n-channel transistor 504 to begin pulling the voltage at node 424 HIGH because n-channel transistor 504 is turned OFF prior to pulling the voltage at node 424 HIGH.

In particular, the voltage at node 508 is LOW when the voltage at node 424 will transition to HIGH. Hence, embodiments of the present invention sense when the voltage at node 508 is going LOW by coupling the gate of low impedance transistor 504 to node 508, turning OFF transistor 504 when node 508 goes LOW. In this manner, when n-channel transistor 404 turns ON and begins providing current to node 424, n-channel transistor 504 is already OFF. Preferably, n-channel transistor 504 is a large, low impedance transistor. When the voltage at node 508 transitions to HIGH and the voltage at node 424 transitions to LOW, n-channel transistor 504 turns ON and provides a strong ground for transistor 408.

Figure 6:
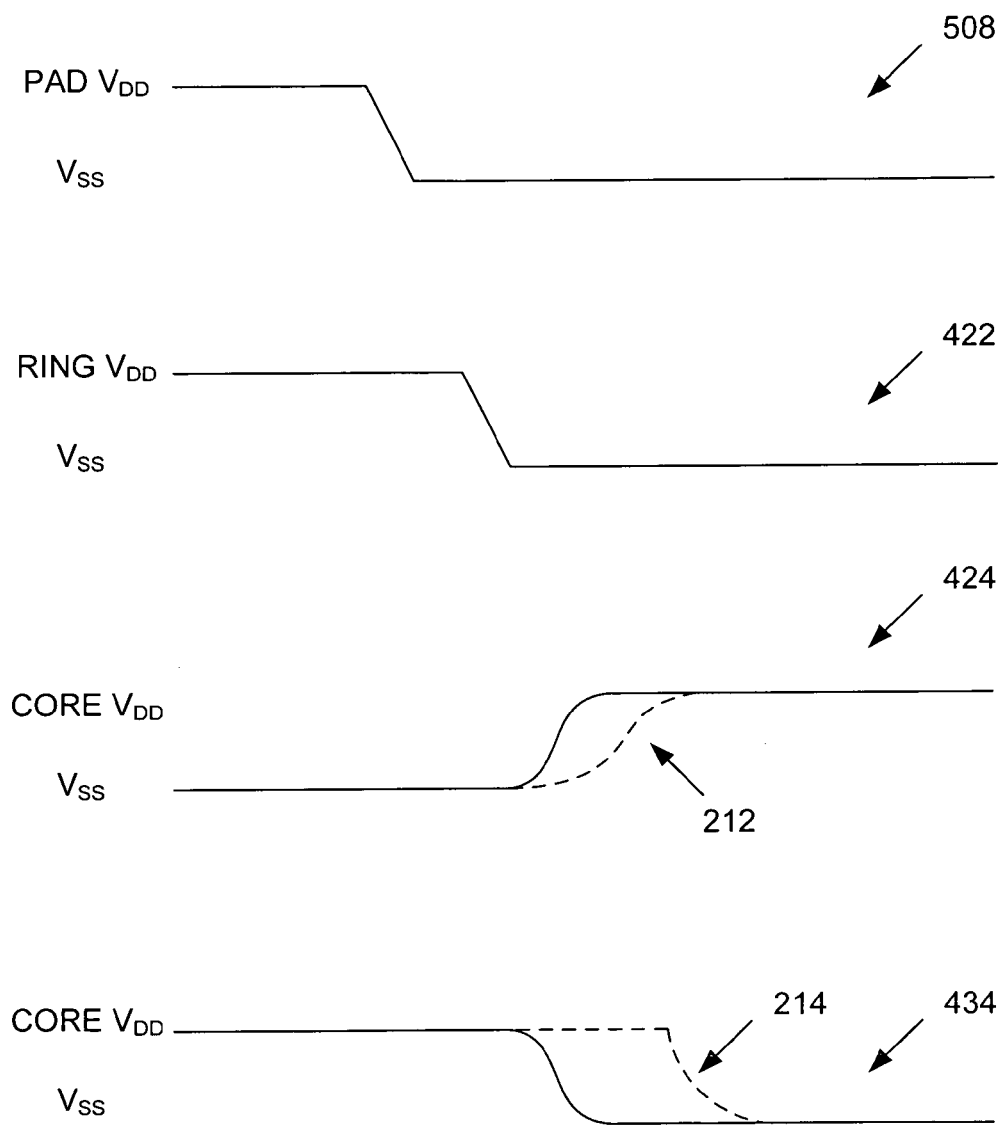
FIG. 6 is a graph showing waveforms for a plurality of nodes in the feed forward circuit, in accordance with an embodiment of the present invention.

Embodiments of the present invention can switch the voltage at node 424 HIGH quickly because transistor 504 is turned OFF when the voltage at node 424 transitions to HIGH. Embodiments of the present invention do not sacrifice drive strength when transitioning the voltage at node 424 LOW because the feed forward transistor 404 is OFF. The voltage at node 508 must transition to HIGH, to cause the voltage at node 424 to transition LOW. As node 508 transitions HIGH, transistor 404 turns OFF and transistor 504 turns ON. This reduces the circuits operation to a series of 4 inverters (502, 418, and 406/408) with normal gate delays. FIG. 6 is a graph showing waveforms for a plurality of nodes in the feed forward circuit, in accordance with an embodiment of the present invention. The waveforms illustrate the voltage change at node 508, node 422, node 424, and node 434 (see FIG. 5). As illustrated in FIG. 6, transitioning node 508 from the HIGH (Pad $V_{DD}$) to LOW causes the voltage at node 422 to transition from RING $V_{DD}$ to LOW. Subsequently, the voltage at node 424 transitions from LOW to Core $V_{DD}$. A dotted line is used to illustrate the same transition at node 212 of the conventional I/O ring circuit of FIG. 1 for comparison purposes. The feed forward capabilities of the embodiments of the present invention allow node 424 to transition from LOW to HIGH much faster than is possible using a conventional I/O ring circuit. The transition from LOW to HIGH at node 424 causes the output node 434 to transition from HIGH to LOW. As above, a dotted line is used to illustrate the same transition at node 214 of the conventional I/O ring circuit of FIG. 1 for comparison purposes. The feed forward capabilities of the embodiments of the present invention allow node 434 to transition from HIGH to LOW much faster than is possible using a conventional I/O ring circuit.

Figure 7A:
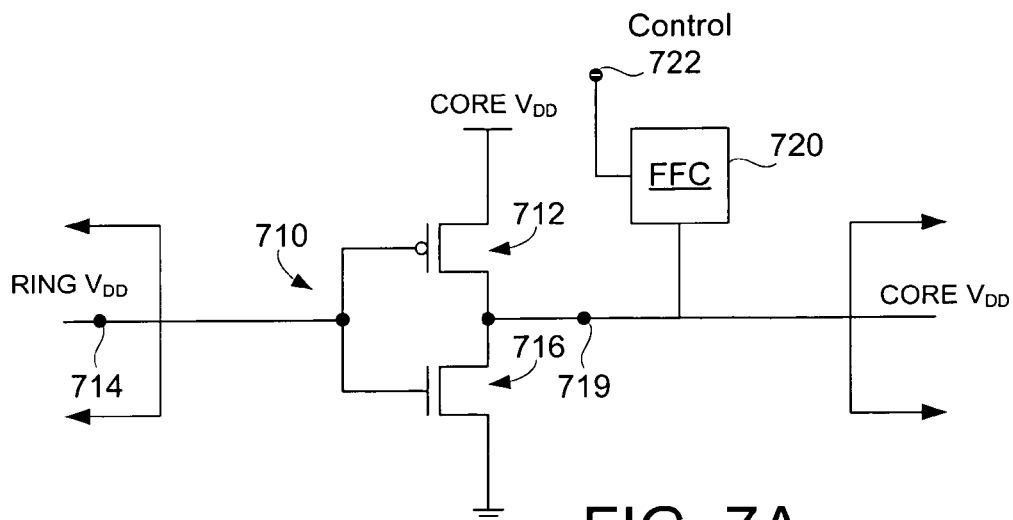
FIGS. 7A and 7B illustrate circuit diagrams of alternatives for the feed-forward circuit, in accordance with the invention.
Figure 7B:
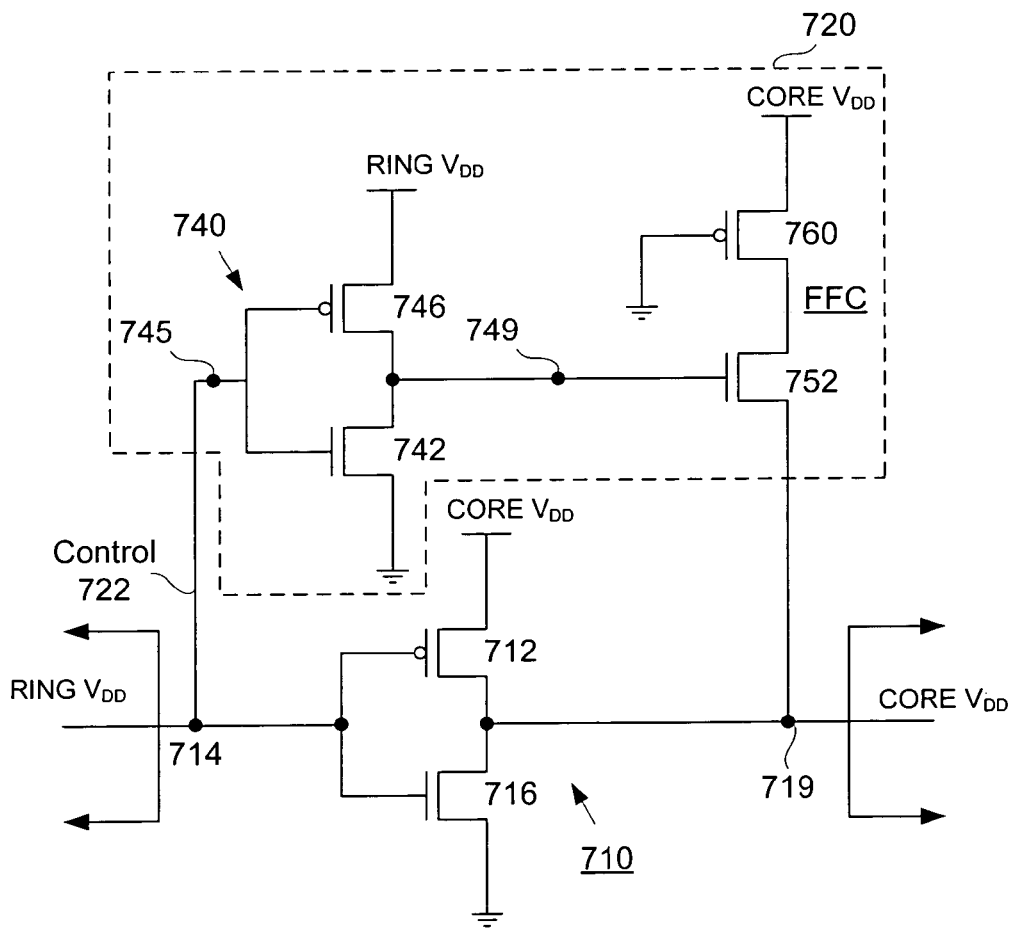

An alternative embodiment of the present invention is illustrated in FIGS. 7A and 7B. As shown in FIG. 7A, this embodiment comprises an inverter 710, further comprised of p-channel transistor 712 whose source is coupled to core $V_{DD}$, whose gate is coupled to an I/O input 714 at Ring $V_{DD}$ and whose drain is coupled to the drain of n-channel transistor 716. Transistor 716 further has its gate coupled to I/O input 714 and its source coupled to ground. A feed-forward circuit 720 is coupled to the drain of transistor 712 and the drain of transistor 716 on output node 719, and a control signal input line 722 determines when feed forward circuit 720 activates to pull node 719 "high".

As shown in further detail in FIG. 7B, feed forward circuit 720 is comprised of inverter 740, further formed of n-channel transistor 742 and p-channel transistor 746. Input node 745 of inverter 740 is coupled through input node 714 to inverter 710. Output node 749 of inverter 740 is coupled to the gate of n-channel transistor 752. Transistor 752 further has a drain coupled to inverter 710's output node 719 and a source coupled to p-channel transistor 760. P-channel transistor 760 has a source coupled to core $V_{DD}$ and a gate coupled to ground. This alternative embodiment works similarly to those other embodiments already described.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A feed forward circuit for reducing delay through an input buffer, comprising:
    an inverter having an input and an output, the inverter being defined by transistors of a first size and powered by a first voltage level;
    an inverting circuit having an input and an output, the input of the inverting circuit being coupled to the output of the inverter, the inverting circuit being defined by transistors of the first size and powered by a second voltage level that is lower than the first voltage level, the inverting circuit being powered by the second voltage level enables transitioning to the second voltage level; and
    a feed forward transistor of a second size that is smaller than the first size has a gate coupled to the input of the inverter and powered by the second voltage level, and the feed forward transistor further having a terminal coupled to the output of the inverting circuit, wherein the feed forward transistor decreases an amount of time required for the output of the inverting circuit to change state when the inverting circuit is powered by the second voltage level;
    wherein the inverting circuit includes a p-channel transistor and an n-channel transistor, the p-channel transistor having a first terminal coupled to the second voltage, a gate coupled to the input of the inverting circuit, and a second terminal coupled to a first terminal of the n-channel transistor, the n-channel transistor having a gate coupled to the input of the inverting circuit, and further including a high impedance transistor coupled to a second terminal of the n-channel transistor of the inverting circuit, the high impedance transistor having a terminal coupled to ground; and further comprising a low impedance transistor coupled to the second terminal of the n-channel transistor of the inverting circuit, the low impedance transistor having a terminal coupled to ground, wherein the low impedance transistor is ON when the output of the inverting circuit is HIGH.

2. A feed forward circuit as recited in claim 1, wherein the low impedance transistor is OFF when the output of the inverting circuit is LOW.

* * * * *